(12) United States Patent
Faber

(10) Patent No.: US 9,141,536 B2
(45) Date of Patent: Sep. 22, 2015

(54) NONVOLATILE MEMORY WEAR MANAGEMENT

(75) Inventor: Robert W. Faber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 13/991,392

(22) PCT Filed: Nov. 4, 2011

(86) PCT No.: PCT/US2011/059464
§ 371 (c)(1),
(2), (4) Date: Jun. 3, 2013

(87) PCT Pub. No.: WO2013/066357
PCT Pub. Date: May 10, 2013

(65) Prior Publication Data
US 2013/0268725 A1    Oct. 10, 2013

(51) Int. Cl.
*G06F 12/00* (2006.01)
*G06F 12/02* (2006.01)
*G11C 16/34* (2006.01)

(52) U.S. Cl.
CPC .......... *G06F 12/0246* (2013.01); *G11C 16/349* (2013.01); *G06F 2212/7211* (2013.01)

(58) Field of Classification Search
None
See application file for complete search history.

(56) References Cited

U.S. PATENT DOCUMENTS

| | | | | |
|---|---|---|---|---|
| 7,366,825 | B2 * | 4/2008 | Williams et al. | 711/103 |
| 8,001,318 | B1 * | 8/2011 | Iyer et al. | 711/103 |
| 2009/0089485 | A1 | 4/2009 | Yeh | |
| 2009/0172250 | A1 * | 7/2009 | Allen et al. | 711/103 |
| 2009/0276586 | A1 * | 11/2009 | Royer et al. | 711/154 |
| 2009/0300276 | A1 * | 12/2009 | Torabi | 711/103 |
| 2011/0035536 | A1 | 2/2011 | Shim et al. | |
| 2011/0066789 | A1 | 3/2011 | Wakrat et al. | |
| 2011/0072189 | A1 | 3/2011 | Post et al. | |
| 2011/0161563 | A1 * | 6/2011 | Chang et al. | 711/103 |
| 2012/0198123 | A1 * | 8/2012 | Post | 711/103 |

FOREIGN PATENT DOCUMENTS

| | | |
|---|---|---|
| KR | 10-2007-0034762 A | 3/2007 |
| KR | 10-2011-0014923 A | 2/2011 |
| KR | 10-2011-0031130 A | 3/2011 |

OTHER PUBLICATIONS

International Search Report and Written Opinion for PCT/US2011/059464, mailed Jul. 27, 2012, 6 pages.
International Preliminary Report on Patentability mailed May 15, 2014 for International Application No. PCT/US2011/059464, 5 pages.

* cited by examiner

*Primary Examiner* — Kaushikkumar Patel
(74) *Attorney, Agent, or Firm* — Schwabe, Williamson & Wyatt, P.C.

(57) ABSTRACT

Embodiments describe methods, apparatus, and system configurations for providing targeted wear management in nonvolatile memory. Specifically, embodiments may include a memory controller to receive a memory access request directed to a storage unit of the nonvolatile memory. The memory controller may access metadata in the storage unit and determine whether to perform a memory access in accordance with the memory access request based on the state information. Other embodiments may be described or claimed.

23 Claims, 5 Drawing Sheets

NONVOLATILE MEMORY WEAR MANAGEMENT

CROSS REFERENCE TO RELATED APPLICATION

The present application is a national phase entry under 35 U.S.C. §371 of International Application No. PCT/US2011/059464, filed Nov. 4, 2011, entitled "NONVOLATILE MEMORY WEAR MANAGEMENT," which designates the United States of America and the entire contents and disclosures of which are hereby incorporated by reference in their entireties.

FIELD

Embodiments of the present disclosure generally relate to the field of memory management, and more particularly, to wear management in nonvolatile memory.

BACKGROUND

Wear-leveling is a memory management technique used to prevent over-cycling of a particular area of nonvolatile memory. Wear-leveling often includes the establishment and maintenance of large indirection tables in dynamic random-access memory (DRAM) that are referenced in the logical-to-physical address mapping used in memory accesses. While this type of memory management may effectively prevent over-cycling, it may also require considerable firmware complexity.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

Embodiments of the present disclosure describe wear management for nonvolatile memory that provides targeted management of highly utilized areas of the nonvolatile memory. As will be shown, this targeted management may be provided without having to maintain large indirection tables in DRAM. In some embodiments, this targeted management may be provided by storing, in each storage unit, metadata that is indicative of whether the storage unit is in a proxy state or a non-proxy state.

Figure 1:
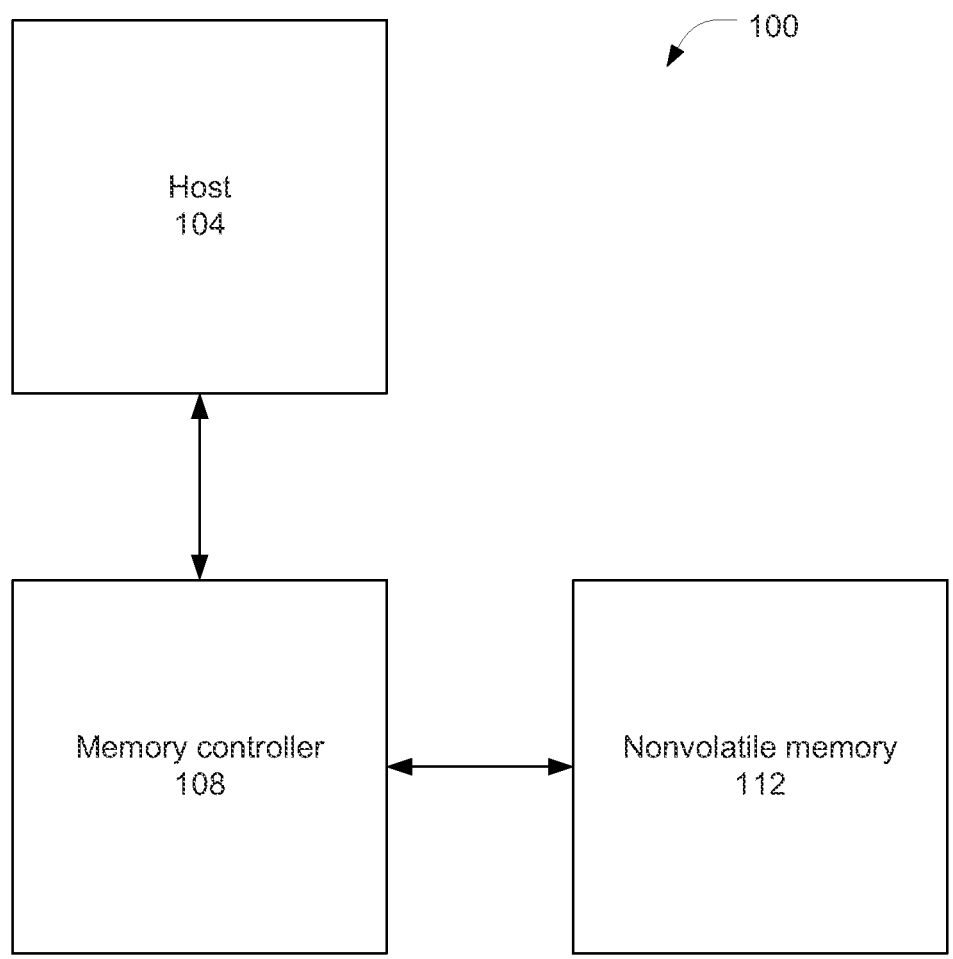
FIG. 1 illustrates a device in accordance with some embodiments.

FIG. 1 illustrates a device 100 in accordance with some embodiments. The device 100 may include a host 104, coupled with a memory controller 108 that is, in turn, coupled with a nonvolatile memory 112.

The nonvolatile memory 112 may include, e.g., a phase-change memory array, which may include a phase-change memory and switch (PCMS) array. PCMS memory, in particular, has high write-cycling endurance with the average wear being relatively lower than other types of nonvolatile memory. However, there still may be instances of over-cycling of particular areas of the memory caused by malware, for example. Thus, utilizing targeted wear management, rather than providing general wear-leveling management utilizing large indirection tables in DRAM, may be especially useful for PCMS memory systems.

While described embodiments may discuss the nonvolatile memory 112 as PCMS memory, the nonvolatile memory 112 may be other types of nonvolatile memory, e.g., NAND flash memory, in other embodiments.

The host 104 may be an entity, e.g., an application, an operating system, etc., that generates a memory access request and transmits the memory access request to the memory controller 108. As used herein, a memory access request may be a request for a memory access, e.g., a read, a write, etc., directed to the nonvolatile memory 112 through the memory controller 108.

The memory controller 108 may access the nonvolatile memory 112 based on the memory access request. The memory controller 108 may integrate management of the highly utilized areas of the nonvolatile memory 112 with the access of the nonvolatile memory 112 as will be described.

Figure 2A:
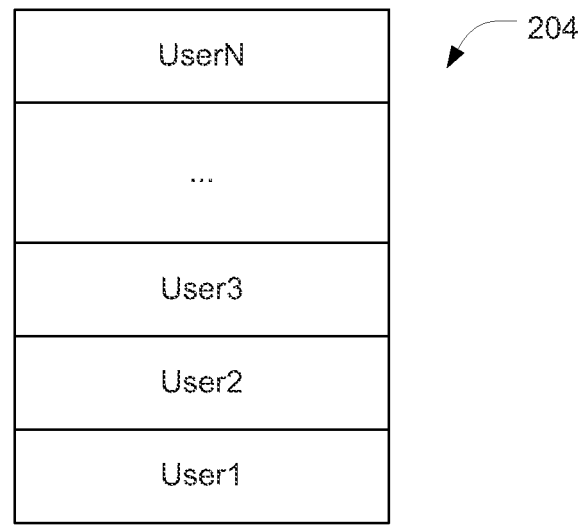
FIGS. 2(a)-2(c) illustrate a number of storage formats in accordance with some embodiments.
Figure 2B:
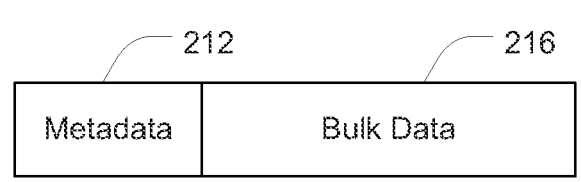
Figure 2C:
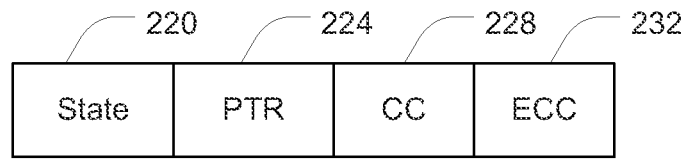

FIGS. 2(a)-2(c) illustrate storage formats that may facilitate targeted management of the highly utilized areas of the nonvolatile memory 112 in accordance with some embodiments. FIG. 2(a) illustrates a portion 204 of the nonvolatile memory array 112 that is divided into a plurality of contiguous user storage units, e.g., User1, User2, . . . UserN. FIG.

2(b) illustrates a storage format of a user storage unit 208, e.g., User1. The storage unit 208 may include metadata 212 and bulk data 216. In some embodiments, the metadata 212 and the bulk data 216 may be independently encoded as separate error correction code (ECC) codewords.

FIG. 2(c) illustrates a format of the metadata 212 in accordance with some embodiments. The metadata 212 may include state information 220, a pointer (PTR) 224, a cycle count (CC) 228, and an ECC 232. The state information 220 may indicate the storage state of storage unit 208. In some embodiments, the storage states that may be identified by the state information 220 may include an empty state, a home state, an away state, and a swapped state.

An empty state may indicate there is not a direct-mapped storage unit at this location, e.g., the physical address of the storage unit is not mapped to any logical address. The empty state may be used for spare locations that are not visible to a user logical space.

A home state may indicate that the storage unit stores (or will store) data, as the bulk data, that it is expected to store. Expected data, may be the data that the host 104 associates with the logical address that is directly mapped to the physical address of the storage unit. At time zero, all direct-mapped storage units may be in this home state.

An away state may indicate that the expected data of the storage unit has been relocated to another storage unit. The bulk data at a storage unit that is in an away state is, therefore, not valid.

A swapped state may indicate that the expected data of the storage unit has been reciprocally swapped with expected data of another storage unit.

The away state and the swapped state may be considered proxy states, while the home state may be considered a non-proxy state.

In the event that the state information 220 indicates that the storage unit 208 is in a proxy state, the pointer 224 may reference another storage unit that stores (or is to store) the expected data of the storage unit 208. The pointer 224 may be a physical address of the other storage unit or some other information that may be used to determine the physical address.

The cycle count 228 may indicate a number of write cycles the storage unit 208 has experienced. This may be used to identify the highly-utilized and lowly-utilized storage units as will be described below.

The ECC 232 may be check bits (or parity bits) of an error correction code that may be used to protect the information of the metadata 212.

Figure 3:
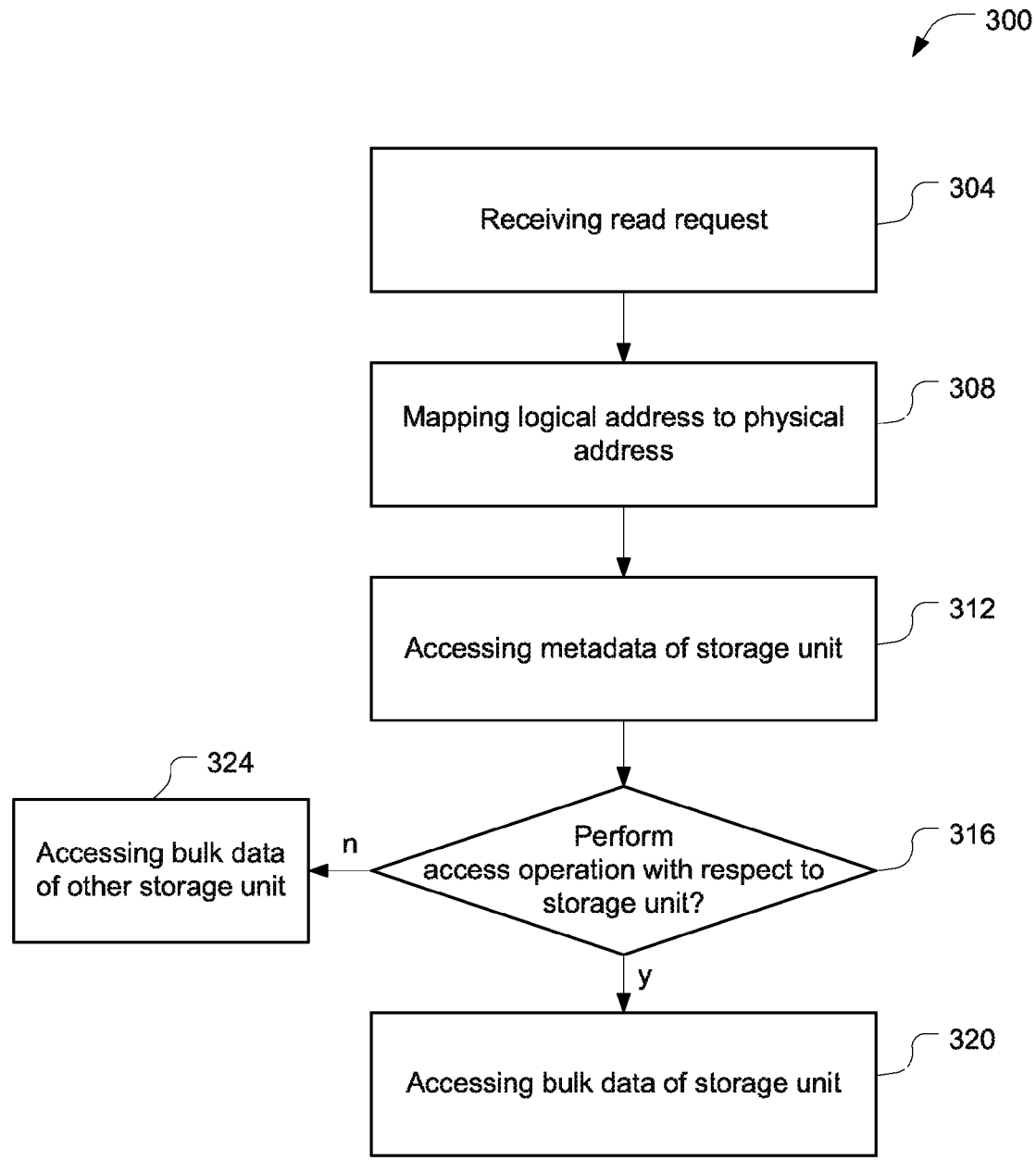
FIG. 3 is a flowchart depicting a memory access operation in accordance with some embodiments.

FIG. 3 is a flowchart 300 depicting an access operation that may be performed by, e.g., the memory controller 108, in accordance with some embodiments. At block 304, the access operation may include receiving a memory access request, e.g., from the host 104. The memory access request may be a read request or a write request. The memory access request may include a logical address to which the memory access request is directed.

At block 308, the access operation may include mapping the logical address to a physical address. In some embodiments, the logical-to-physical mapping of block 308 may be a computation involving the logical address and a constant multiplier, though other embodiments may use other mapping techniques. The direct mapping of the logical address to the physical address may be preserved throughout operation of the device 100, thereby obviating establishment and maintenance of indirection tables in DRAM that would otherwise need to be referenced during a logical-to-physical mapping.

At block 312, the access operation may include accessing metadata of the storage unit identified by the physical address, which may be referred to as the target storage unit. Accessing the metadata may include retrieving the metadata from the target storage unit and, if the metadata is encoded, decoding the metadata.

At block 316, the access operation may include determining whether to perform the access operation with respect to the target storage unit. This may involve determining, e.g., by the memory controller 108 referencing the state information of the accessed metadata, whether the target storage unit is in a proxy state or in a non-proxy state.

If it is determined, at block 316, that the target storage unit is in a non-proxy state, the access operation may proceed to performing an access operation with respect to the target storage unit at block 320. If the memory access request is a read request, the access operation may include a read of the bulk data of the target storage unit, which may then be returned to the requesting entity, e.g., the host 104, to complete the access operation. If the memory access request is a write request, the access operation may include a write of data, included with the write request, as the bulk data of the target storage unit. If the access operation includes a write of data, it may further include a rewrite of the metadata to, e.g., increase the cycle count.

If it is determined, at block 316, that the target storage unit is in a proxy state, the access operation may proceed to performing the access operation with respect to a proxy storage unit at block 324. The proxy storage unit may be the storage unit referenced by the pointer in the metadata. If the memory access request is a read request, the access operation may include a read of the bulk data of the proxy storage unit, which may then be returned to the requesting entity, e.g., the host 104, to complete the access operation. If the memory access request is a write request, the access operation may include a write of data, included with the write request, as the bulk data of the proxy storage unit and a rewrite of the cycle count within the metadata of the proxy storage unit.

In embodiments in which the memory access request is a read request, the access of the metadata and the access of the bulk data of the target storage unit may be separate operations with the latter only being performed if it is first determined that the target storage unit is in a non-proxy state. This may be advantageous, e.g., when the metadata and the bulk data are stored as separate codewords. However, in some embodiments, the access of the bulk data may be done contemporaneously with the access of the metadata. This may be advantageous in embodiments in which only a relatively small portion of the storage units are in proxy states and/or contemporaneous access of the metadata and the bulk data saves time/resources as compared to sequential access of the metadata and bulk data. In the event that metadata and bulk data are contemporaneously accessed, the bulk data may be disregarded in the event it is later determined that the target storage unit is in a proxy state.

Figure 4:
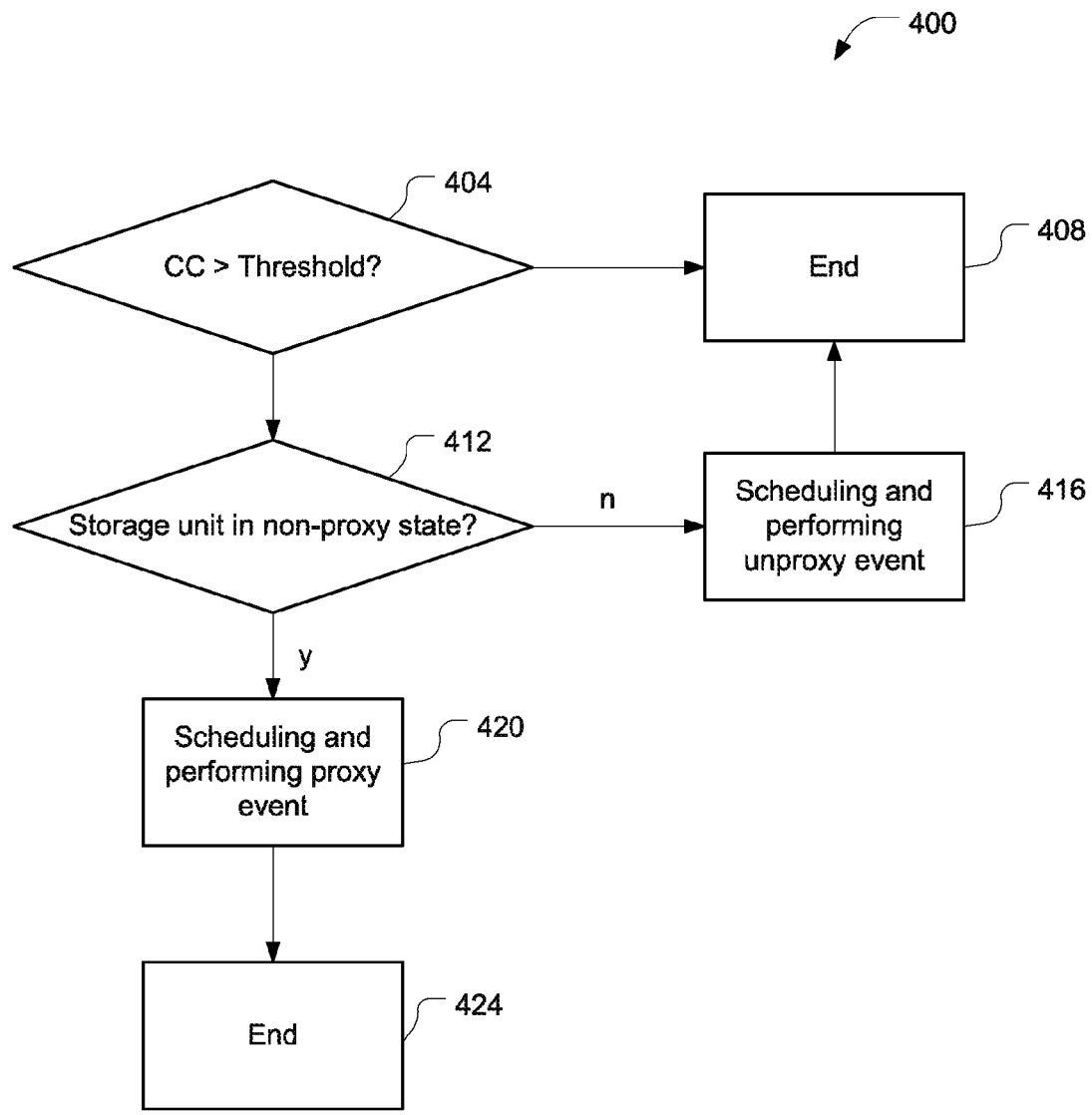
FIG. 4 is a flowchart depicting a maintenance operation in accordance with some embodiments.

FIG. 4 is a flowchart 400 depicting a maintenance operation of a storage unit in accordance with some embodiments. The maintenance operation may be done by the memory controller 108 contemporaneously with a write access of a storage unit that is either the target storage unit or a proxy storage unit.

At block 404, the maintenance operation may include a determination of whether a cycle count, found in the cycle count 228, is greater than a predetermined threshold value. The predetermined threshold value may correspond to an indication of a highly-utilized storage unit.

In some embodiments, the predetermined threshold value may be a common value shared by all storage units of the nonvolatile memory 112 or it may be individualized to a particular storage unit or group of storage units. This value may be static over the life of the device 100 or it may be dynamically adjusted based on one or more operating conditions, past threshold values, etc. In embodiments in which a predetermined threshold value is individualized to a particular storage unit, the threshold value may be included in the storage unit's metadata.

If it is determined, at block 404, that the cycle count is not greater than the predetermined threshold value, the maintenance operation may end at block 408.

If it is determined, at block 404, that the cycle count is greater than the predetermined threshold value, the maintenance operation may proceed to block 412.

At block 412, it may be determined whether the storage unit is in a non-proxy state by referencing state information of the metadata of the storage unit.

If, at block 412, it is determined that the storage unit is not in a non-proxy state, i.e., is in a proxy state such as away state or swapped state, the maintenance operation may advance to scheduling and performing an unproxy event at block 416. In the event it is determined that the storage unit is in a proxy state during a write access, the storage unit will be the proxy storage unit to which data, associated with the target storage unit, is written. The unproxy event may then include rewriting the metadata of the proxy storage unit and the target storage unit to set the state information to indicate that the storage units are in non-proxy states. The unproxy event may further include copying the bulk data of the proxy storage unit to the target storage unit. At a later time, e.g., a subsequent write to the target storage unit, the target storage unit may be re-proxied with a lowly-utilized storage unit by, e.g., going through block 420 described below.

Unproxying a highly-utilized proxy storage unit and, subsequently, re-proxying the target storage unit, as described, may allow single-level indirection to be maintained so that the pointer in the target storage unit points to the proxy storage unit that stores the expected data. This may, in turn, facilitate preservation of the logical-to-physical mapping throughout operation, as the expected data will be found in either the first or second access of a storage unit.

If, at block 412, it is determined that the storage unit is in a non-proxy state, i.e., a home state, the maintenance operation may advance to scheduling and performing a proxy event at block 420. The proxy event may include rewriting the metadata of the target storage unit and a proxy storage unit to set the state information to a proxy state, i.e., away state or swapped state, and the pointer to reference the proxy storage unit. The proxy event may further include copying bulk data from the target storage unit to the proxy storage unit. If the proxy event is to set the storage unit in a swapped state, some embodiments may employ temporary storage unit(s) to facilitate the reciprocal transfer of data between the two storage units that are being swapped.

Selection of the storage unit to serve as a proxy storage unit may be facilitated by the memory controller maintaining utilization lists of storage units. For example, the utilization lists may include a low-utilization list of storage units that have cycle counts less than a predetermined threshold value and are, therefore, candidates for serving as proxy storage units. During a proxy event, a proxy storage unit may be selected from the low-utilization list and associated with a target storage unit.

In some embodiments proxy/unproxy events may first be scheduled and then later performed in a batch process with the contemporaneous rewriting of metadata for a group of storage units. In order to provide some flexibility for the timing between scheduling a proxy/unproxy event and performing the proxy/unproxy event, it may be desirable to set the predetermined threshold value to a value that is safely below the maximum cycle count of the storage units.

In other embodiments, scheduling of a proxy/unproxy event for a storage unit may be followed directly by performance of the proxy/unproxy event.

Following the scheduling and performing of the proxy event in block 420, the maintenance operation may end at block 424.

Figure 5:
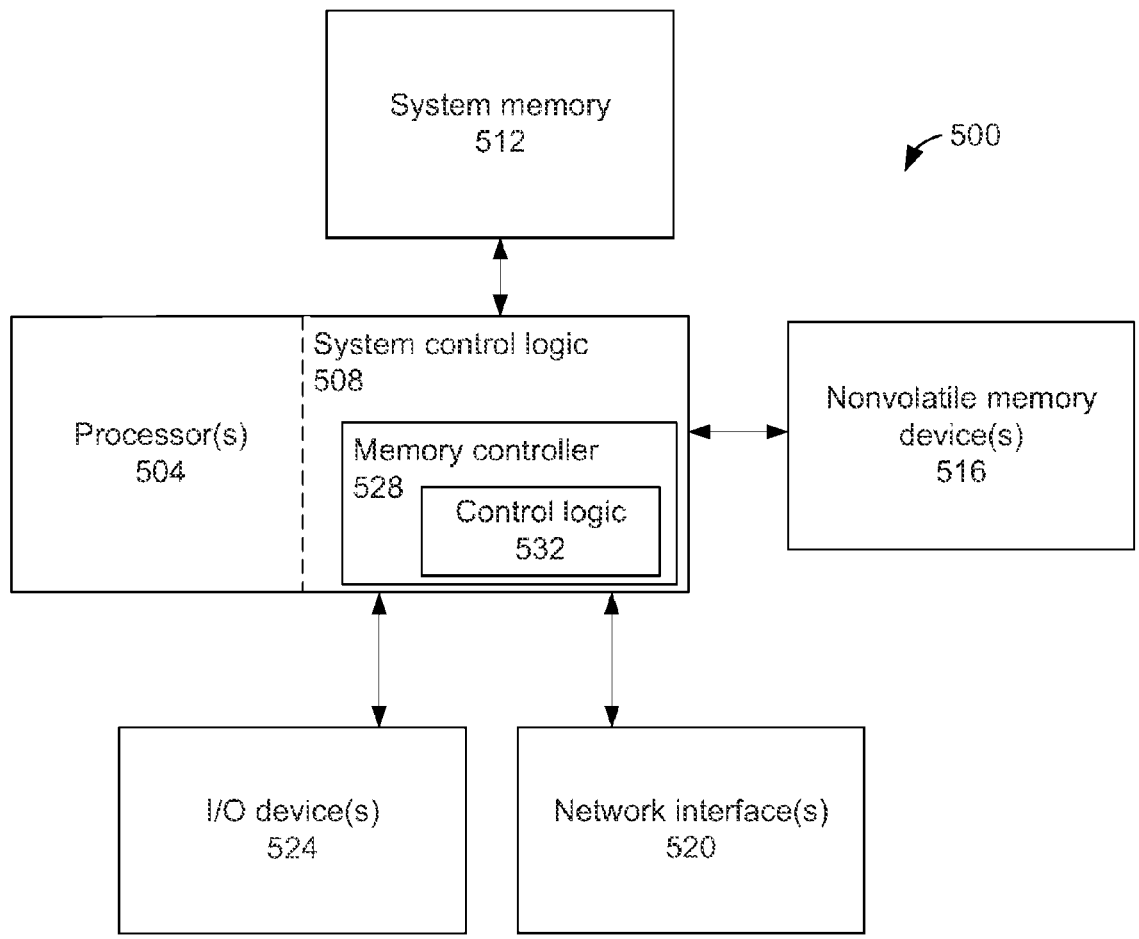
FIG. 5 illustrates a system in accordance with some embodiments.

Embodiments of the present disclosure may be implemented into a system using any suitable hardware and/or software to configure as desired. FIG. 5 illustrates, for one embodiment, an example system 500 comprising processor(s) 504, system control logic 508 coupled to, or integrated with, at least one of the processor(s) 504, system memory 512 coupled to system control logic 508, nonvolatile memory device(s) 516 coupled to system control logic 508, network interface(s) 520 coupled to system control logic 508, and input/output device(s) 524 coupled to system control logic 508.

The processor(s) 504 may include one or more single-core or multi-core processors. The processor(s) 504 may include any combination of general-purpose processors and dedicated processors (e.g., graphics processors, application processors, etc.). Applications, operating systems, etc., executing on the processor(s) 504 may be similar to host 104 and may issue the memory access requests directed to the nonvolatile memory device(s) 516 similar to that described above with respect to FIG. 1.

System control logic 508 for one embodiment may include any suitable interface controllers to provide for any suitable interface to at least one of the processor(s) 504 and/or to any suitable device or component in communication with system control logic 508.

System control logic 508 for one embodiment may include one or more memory controller(s), e.g., memory controller 528, to provide an interface to system memory 512 and nonvolatile memory device(s) 516. System memory 512 may be used to load and store data and/or instructions, for example, for system 500. System memory 512 for one embodiment may include any suitable volatile memory, such as suitable dynamic random access memory (DRAM), for example.

The nonvolatile memory device(s) 516 may include one or more tangible, non-transitory computer-readable media used to store data and/or instructions, for example. The nonvolatile memory device(s) 516 may include nonvolatile memory similar to nonvolatile memory 112 that may be implemented in, for example, a solid state drive (SSD). The nonvolatile memory device(s) 516 may further include any suitable nonvolatile storage device(s), such as one or more hard disk drive(s) (HDD(s)), compact disk (CD) drive(s), and/or digital versatile disk (DVD) drive(s), for example.

The nonvolatile memory device(s) 516 may include a storage resource physically part of a device on which the system 500 is installed or it may be accessible by, but not necessarily a part of, the device. For example, a portion of the nonvolatile memory device(s) 516 may be accessed over a network via the network interface(s) 520.

The memory controller 528 may include control logic 532 that performs the memory access and maintenance operations described herein. The control logic 532 may include instructions that are executed by at least one of the processor(s) 504 to perform the described operations.

System control logic 508 for one embodiment may include one or more input/output (I/O) controller(s) to provide an interface to network interface(s) 520 and I/O device(s) 524.

Network interface(s) 520 may provide one or more interface(s) for system 500 to communicate over one or more network(s) and/or with any other suitable device. Network interface(s) 520 may include any suitable hardware and/or firmware. Network interface(s) 520 for one embodiment may include, for example, a network adapter, a wireless network adapter, a telephone modem, and/or a wireless modem. For wireless communications, network interface(s) 520 may use one or more antennas.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic, e.g., control logic 532, for one or more controller(s), e.g., memory controller 528, of system control logic 508 to form a System on Chip (SoC) package.

The I/O device(s) 524 may include user interfaces designed to enable user interaction with the system 500, peripheral component interfaces designed to enable peripheral component interaction with the system 500, and/or sensors designed to determine environmental conditions and/or location information related to the system 500. In various embodiments, the user interfaces could include, but are not limited to, a display, e.g., a liquid crystal display, a touch screen display, etc., a speaker, a microphone, a still camera, a video camera, a flashlight (e.g., a light emitting diode flash), and a keyboard. In various embodiments, the peripheral component interfaces may include, but are not limited to, a nonvolatile memory port, an audio jack, and a power supply interface. In various embodiments, the sensors may include, but are not limited to, a gyro sensor, an accelerometer, a proximity sensor, an ambient light sensor, and a positioning unit. The positioning unit may also be part of, or interact with, the network interface(s) 520 to communicate with components of a positioning network, e.g., a global positioning system (GPS) satellite.

In various embodiments, the system 500 may be a mobile computing device such as, but not limited to, a laptop computing device, a tablet computing device, a netbook, a smartphone, etc. In various embodiments, system 500 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
a non-volatile memory array; and
a memory controller coupled with the non-volatile memory array and configured to:
  receive a memory access request, from a host, that is directed to a first storage unit of the non-volatile memory array;
  access metadata in the storage unit that includes state information related to the first storage unit that indicates a non-proxy state of the first storage unit; determine that a cycle count associated with the first storage unit is greater than a predetermined threshold value;
  rewrite the metadata to include state information that indicates a proxy state of the first storage unit, and a pointer that provides a reference to a second storage unit; and
  copy bulk data of the first storage unit to the second storage unit.

2. The apparatus of claim 1, wherein the memory controller is further configured to:
access, based on said pointer and determination that the state information indicates a proxy state, the second storage unit.

3. The apparatus of claim 2, wherein the proxy state is:
a swapped state to indicate that the second storage unit is to serve as a proxy storage unit for the first storage unit and the first storage unit is to serve as a proxy storage unit for the second storage unit; or
an away state to indicate that the second storage unit is to serve as a proxy storage unit for the first storage unit.

4. The apparatus of claim 2, wherein the memory access request includes a first logical address and the memory controller is further configured to:
perform a logical-to-physical mapping to map the first logical address to a first physical address of the first storage unit.

5. The apparatus of claim 2, wherein the memory controller is further configured to:
access metadata in the second storage unit;
determine, based on the metadata from the second storage unit, a cycle count of the second storage unit is greater than a predetermined threshold;
copy bulk data of the second storage unit to the first storage unit; and
rewrite metadata of the first storage unit to include state information that indicates a non-proxy state of the first storage unit.

6. The apparatus of claim 1, wherein, when the state information indicates a non-proxy state of the first storage unit, the memory controller is further configured to access bulk data stored in the first storage unit based on the state information and the memory access request.

7. The apparatus of claim 6, wherein the metadata is stored in a first codeword in the first storage unit and the bulk data is stored in a second codeword in the first storage unit and the memory controller is configured to:
decode the first codeword;
determine that the first storage unit has the non-proxy state; and
decode the second codeword based on said determination that the first storage unit has the non-proxy state.

8. The apparatus of claim 1, wherein the memory controller is further configured to:
maintain a list of storage units having cycle counts less than the predetermined threshold value; and
select the second storage unit from the list.

9. The apparatus of claim 1, wherein the memory controller is further configured to:
schedule the rewrite of the metadata and the copy of the bulk data based on said determination that the cycle count is greater than the predetermined threshold value; and contemporaneously rewrite a plurality of metadata stored at a respective plurality of storage units.

10. The apparatus of claim 1, wherein the memory controller is further configured to determine the predetermined threshold based on the metadata.

11. The apparatus of claim 1, wherein the non-volatile memory array is a phase-change memory array.

12. A non-transitory machine-readable medium having associated instructions that, when executed by a machine, result in operations including:
   determining, a cycle count of a storage unit of a non-volatile memory array exceeds a predetermined threshold; and
   writing, in metadata stored at the storage unit, state information that indicates a non-proxy state to state information that indicates a proxy state of the storage unit, and further writing, in the metadata, a pointer that provides a reference to a proxy storage unit of the non-volatile memory array, said writing based on said determining the cycle count exceeds the predetermined threshold; and
   copying bulk data of the storage unit to the proxy storage unit.

13. The non-transitory machine-readable medium of claim 12, wherein the proxy state is a swapped state and the operations further include:
   writing, in metadata stored at the proxy storage unit, state information to indicate a swapped state of the proxy storage unit and another pointer that provides a reference to the storage unit.

14. The non-transitory machine-readable medium of claim 12, wherein the operations further include:
   receiving a memory access request that is directed to the storage unit;
   retrieving, from the storage unit, metadata that includes the pointer and the state information that indicates the proxy state of the storage unit; and
   accessing the proxy storage unit based on the memory access request, the state information, and the pointer.

15. The non-transitory machine-readable medium of claim 14, wherein the memory access request includes a logical address and the operations further include:
   mapping the logical address to a physical address of the storage unit.

16. The non-transitory machine-readable medium of claim 15, wherein said mapping is to occur after said writing of the metadata to indicate the proxy state of the storage unit.

17. The non-transitory machine-readable medium of claim 14, wherein said accessing the proxy storage unit comprises writing data to the proxy storage unit and the operations further include:
   determining a cycle count of the proxy storage unit is greater than the predetermined threshold;
   copying data of the proxy storage unit to the storage unit; and
   rewrite metadata of the storage unit to include state information that indicates a non-proxy state of the storage unit.

18. The non-transitory machine-readable medium of claim 12, wherein the operations further include:
   selecting the proxy storage unit from a list of storage units having cycle counts with a value that is less than the predetermined threshold.

19. The non-transitory machine-readable medium of claim 12, wherein the nonvolatile memory array is a phase-change memory array.

20. A system comprising:
   a nonvolatile memory array;
   a host configured to issue a memory access request including a logical address and an access command;
   a memory controller coupled with the host and the nonvolatile memory array and configured to:
      map the logical address to a physical address of a first storage unit of the nonvolatile memory array;
      access metadata stored at the first storage unit that includes a pointer that provides reference to a second storage unit and state information that indicates a proxy state of the first storage unit;
      access, based on said pointer and determination that the state information indicates a proxy state, the metadata in second storage unit;
      determine, based on the metadata from the second storage unit, a cycle count of the second storage unit is greater than a predetermined threshold;
      copy bulk data of the second storage unit to the first storage unit; and
      rewrite metadata of the first storage unit to include state information that indicates a non-proxy state of the first storage unit.

21. The system of claim 20, wherein the memory controller is further configured to:
   determine, based on state information and a pointer in the metadata, that the access command is to be performed with respect to a second storage unit; and
   access the second storage unit to perform the access command.

22. The system of claim 20, wherein the nonvolatile memory array is a phase-change memory array.

23. The system of claim 20, wherein control logic of the memory controller is integrated with a processor of the system in a System on a Chip (SOC) package.

* * * * *